Feb. 28, 1967 A. LORO 3,305,913

METHOD FOR MAKING A SEMICONDUCTOR DEVICE BY DIFFUSING IMPURITIES THROUGH SPACED-APART HOLES IN A NON-CONDUCTING COATING TO FORM AN OVERLAPPED DIFFUSED REGION BY MEANS OF TRANSVERSE DIFFUSION UNDERNEATH THE COATING

Filed Sept. 11, 1964 2 Sheets-Sheet 1

INVENTOR
ALBERTO LORO
Cumphey & Erickson
PATENT AGENT

METHOD FOR MAKING A SEMICONDUCTOR DEVICE BY DIFFUSING IMPURITIES THROUGH SPACED-APART HOLES IN A NON-CONDUCTING COATING TO FORM AN OVERLAPPED DIFFUSED REGION BY MEANS OF TRANSVERSE DIFFUSION UNDERNEATH THE COATING

Filed Sept. 11, 1964 2 Sheets-Sheet 2

*INVENTOR*
ALBERTO LORO
Cumphey & Erickson
*PATENT AGENT*

United States Patent Office 3,305,913

Patented Feb. 28, 1967

3,305,913

METHOD FOR MAKING A SEMICONDUCTOR DEVICE BY DIFFUSING IMPURITIES THROUGH SPACED-APART HOLES IN A NON-CONDUCTING COATING TO FORM AN OVERLAPPED DIFFUSED REGION BY MEANS OF TRANSVERSE DIFFUSION UNDERNEATH THE COATING

Alberto Loro, Ottawa, Ontario, Canada, assignor to Northern Electric Company Limited, Montreal, Quebec, Canada Filed Sept. 11, 1964, Ser. No. 395,838
5 Claims. (Cl. 29—25.3)

This invention relates to a method for making semiconductor devices and is particularly suitable for making planar silicon transistors useful for high frequency applications. The invention also relates to a transistor having improved emitter injection efficiency characteristics and breakdown characteristics.

It is well known that the frequency response of a transistor is limited by the time delay associated with: (a) the conduction of current carriers across the base region of the transistor to the base-collector junction; and (b) the base-collector junction capacitance.

The time delay associated with the conduction of current carriers is influenced by the base width. Thus, the transit time for current carriers across the base region can be reduced by making the base width very narrow during fabrication of the transistor.

Since the base-collector junction capacitance varies directly with the junction area, the effect of this junction capacitance on the frequency response can be reduced by making the junction area smaller.

Thus for high frequency applications it can be readily appreciated why development in transistor technology has been directed to the production of very small sized transistor structures having very narrow base regions and small junction areas.

However, one of the major problems associated with the manufacture of transistors having both very narrow base regions and small junction areas is the difficulty of providing sufficient area on the surface of the base region for application of the base contact. The available surface area is often so small that there is a serious danger of having the base contact short circuit the emitter contact. This danger was compounded because the base contact often had to be applied over substantially the complete surface area of the base region to minimize the spreading resistance in the bulk of the base region.

To overcome this problem, prior art methods were forced to employ a larger base area to provide sufficient base contact area at the surface remote from the emitter contact area. Such a base contact area usually took the form of an annular band surrounding the emitter area. However, the larger base area resulted in a base-collector junction capacitance that was much larger than desirable for high frequency applications.

I have discovered a method for making a transistor of sufficiently minute geometry to make it suitable for high frequency applications while at the same time providing adequate base contact area and minimum base spreading resistance.

According to my invention, I first diffuse an impurity into a first hole opened through an oxide coating on a plane surface of a semiconductor body to form a first region of opposite conductivity type to the original semiconductor body, with the region extending by transverse diffusion underneath the coating to the surface. I reform a non-conducting coating on the surface within this area and then diffuse an impurity into a second hole which is opened through the original coating to the surface to form a second region of the same conductivity type as the first region. The second hole is adjacent to, but spaced from, the first hole and the first and second holes are sufficiently close together so that the second region merges with and overlaps the first region. Thus a P-N junction is defined between the merged regions and the remainder of the body. This junction extends to the surface underneath the coating about the merged regions, and the second region overlaps the first region at the surface in an area of the first region formed by the transverse diffusion.

Further diffusion steps can then be performed through the surface of the second region as required. For example, in the manufacture of a transistor, the first and second regions would form the base region and a further diffusion into the second hole would form the emitter region. Then, according to my invention, a third hole can be opened through the reformed coating to the surface of the first region and ohmic contacts applied to the surface within the second and third holes.

In the manufacture of a transistor for high frequency applications, I prefer to make a deep diffusion (about $1.5 \times 10^{-3}$ centimeters) with an impurity having a high surface concentration (greater than $10^{20}$ atoms per cubic centimeter) when forming the first region. Thus, a heavily conducting region within the body of the semiconductor itself is formed thereby contributing to the low bulk resistivity of the base region. Therefore, less surface area is required in the base region for applying the base contact. This enables a device to be manufactured that is smaller in total area than other devices requiring larger base surface contact areas.

I also prefer to use a shallower diffusion with a lower surface concentration to form the second region. This provides a steep impurity gradient in that part of the base region immediately below the emitter region to build into the base region the necessary electrostatic field for adding a drift velocity to the diffusion velocity of the current carriers. The deeply diffused first region also produces a shallower diffusion gradient where the portion of the base-collector junction is formed by the first region than the portion of this junction that is formed by the second region. This gives a wider depletion layer in the portion of the base-collector junction formed by the first diffusion than the depletion layer in the portion of the base-collector junction formed by the second diffusion. This wider depletion layer in the deeply diffused region renders the capacitance-per-unit-area smaller than in the portion of the base-collector junction underneath the emitter region proper. This makes the base-collector junction capacitance of devices made by my invention smaller than that produced by prior art methods.

In diffusing the impurity to form the first region, I prefer to remove an annular band of the coating to expose an area of the surface with the band having a portion that is wider than its remaining portions. The term "annular band" as used herein is meant to include bands that take the form of various patterns provided that the band is closed on itself. This band can be very narrow to keep the overall size of the device small. Low resistivity surface contact area is provided by transverse diffusion in the deeply diffused first region. The wider portion of the band serves as the contact area at the surface of the base region.

There is another problem associated with the manufacture of planar transistors that becomes particularly acute when structures of minute size are made. It is customary to first diffuse the base region through a hole in an oxide coating that completely covers a surface of a semiconductor body. The coating is then reformed over the hole and the emitter region is diffused through a smaller hole in the coating. During etching of the smaller hole prior to diffusion of the emitter region, the oxide coating can become easily damaged which sometimes results in tiny cracks in the coating near the area where the base-collector junction reaches the surface underneath the coating. If some of the impurity used during diffusion of the emitter region gets into this area the base-collector junction breakdown voltage can be decreased to the point where unacceptable transistors would result. Because of the high precision required in the fabrication and alignment of photographic plates used in etching the smaller hole, it can be readily seen that this problem becomes more serious when minute transistors are made.

My invention overcomes this problem by eliminating the masking step between the base diffusion and the emitter diffusion steps thereby permitting the emitter region to be diffused through the same hole in the oxide coating that is used to diffuse the base region. The original oxide coating that covers the surface near the area where the base-collector junction reaches the surface is not disturbed during the manufacturing process. Prior to my invention, it was felt to be impracticable to diffuse the base and emitter regions through the same hole in the oxide coating because there would be insufficient surface area in the base region for applying the base contact. However, in my invention, this becomes possible because I have provided for a base contact area by my deeply diffused first region.

The elimination of a masking step between the diffusion of the base and emitter regions also obviates the necessity of regrowing an oxide coating over the base region before the base diffusion step. It is undesirable to regrow the oxide coating if the best gradient in the base region for high frequency response is to be achieved because regrowth of the coating causes a redistribution of the impurities at the surface of the oxide.

In order to obtain a low base series resistance it is desirable that the doping of the base diffused region external to the emitter diffused region should be as heavy as possible. However, heavy base doping in the emitter diffused region can result in poor emitter injection efficiency and breakdown characteristics. In prior art methods these two regions of the base were frabricated simultaneously in the same diffusion and the base doping level selected had to be a comprise between the two conflicting requirements.

According to my invention, my method results in a transistor that has very low base resistance external to the emitter region while permitting separate choice of base doping in the area to be emitter diffused, thereby preserving optimum emitter-base junction characteristics. This is accomplished by ensuring that the hole in the oxide coating used for diffusing the second or shallow region exposes only a portion of the first region at the surface that is formed by transverse diffusion. The transverse diffusion of the heavily conducting first region results in a transverse diffusion gradient such that the impurity concentration is much lower at the exposed area of the surface than at the surface from which the diffusion was performed. The diffusion of the shallow second region merges with and overlaps this exposed area. Thus, when the emitter region is diffused into the same hole, the emitter-base junction reaches the surface in the region of lower surface concentration.

My invention also has application in the manufacture of diffused planar field effect transistors. It is an inevitable consequence of the conventional method of fabricating field effect transistors that breakdown of the upper gate junction occurs first at the surface. This is because the maximum field occurs in this region as a result of transverse diffusion of the upper gate in the high surface concentration of the source and drain regions. This necessarily limits the voltage range of operation for the device. Any attempts to remove this region by etching, or to modify it by compensative doping, present formidable process control problems for comparatively small gains in breakdown voltage.

According to another aspect of my invention, therefore, a field-effect transistor can be fabricated by double diffusion through the same oxide coating coupled with transverse diffusion through other holes in the oxide coating to establish contact to the channel region of the field-effect transistor. By this method, the subsequent upper gate diffusion does not encounter such high surface concentrations due to a previous diffusion. Thus, the surface breakdown is increased to a value nearer to that characteristic of the junction in the channel region itself (a fundamental limiting value). The actual value of breakdown achieved will be dependent on the resistivity of the source and drain diffused region in the vicinity where the upper gate junction is formed.

Preferred embodiments of my invention will now be described, by way of example, with reference to the accompanying drawings in which:

FIG. 2 being a sectional view taken along lines 2—2 of FIG. 1; and FIGS. 3 to 5 being sectional views of the semiconductor device at later stages in its manufacture.

Figure 2:
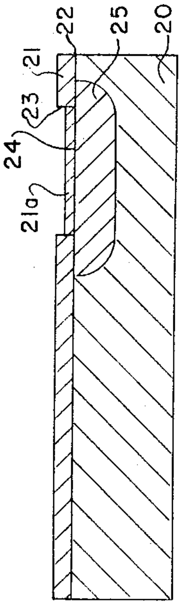
FIGS. 1 to 5 depict my invention in its broadest aspect with FIG. 1 being a plan view of a semiconductor device at one stage of manufacture.
Figure 1:
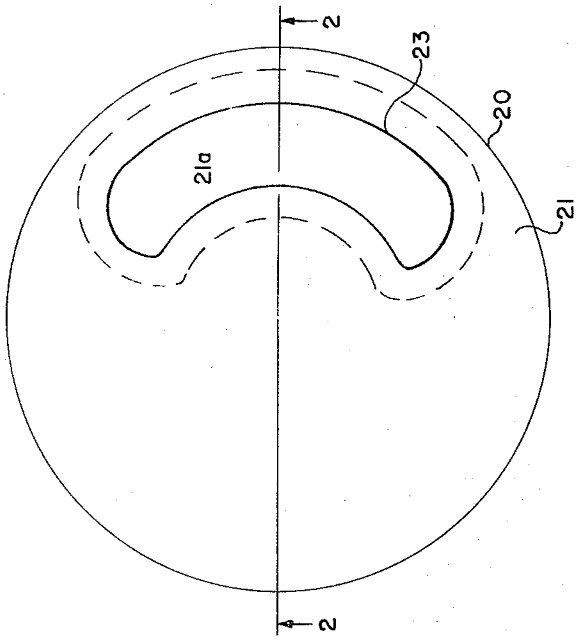

FIGS. 1 and 2 show a semiconductor body 20 of one conductivity type having a non-conducting coating 21 formed on a plane surface 22. A first hole 23 is opened through the coating 21 to expose an area 24 of the surface 22.

An impurity is then diffused into the hole 23 (FIG. 2) to form a first region 25 of opposite conductivity type. It is to be noted that this region extends by transverse diffusion underneath the coating 21 to the surface 22. A non-conducting coating **21*a* is then reformed on the surface 22 within the area 24**.

Figure 3:
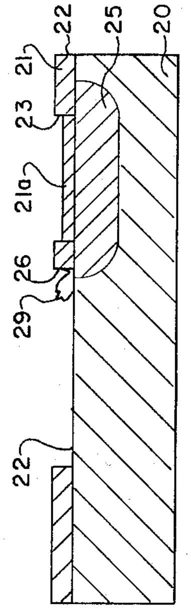
Figure 4:
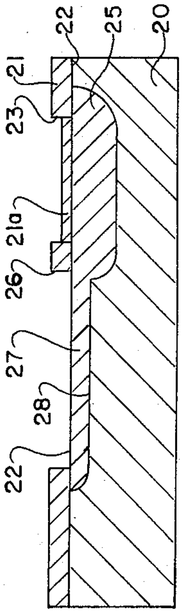

As shown in FIGS. 3 and 4, a second hole 26 adjacent to, but spaced from, the first hole 23 is opened through the original coating 21 to the surface 22. An impurity is diffused into the second hole 26 (FIG. 4) to form a second region 27 of the opposite conductivity type. The first and second holes 23 and 26 respectively must be sufficiently close together so that the second region 27 merges with and overlaps the first region 25 whereby a P-N junction 28 is defined between the merged regions 25 and 27 and the remainder of the body 20. As shown in FIG. 3, the hole 26 was made sufficiently close to the hole 23 so that the portion 29 of the region 25 that is formed by transverse diffusion is exposed at the surface 22. It should be understood, however, that this is not absolutely essential since some transverse diffusion must take place during the diffusion of each region. The junction 28 extends to the surface 22 underneath the coating 21 about the merged regions 25 and 27.

Figure 5:
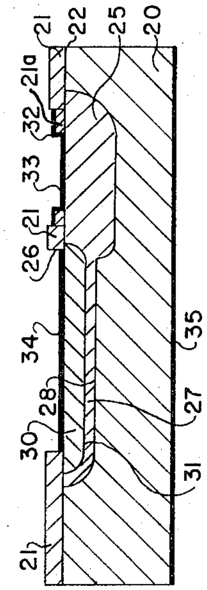

If the final device is to be a transistor, the oxide coating may be regrown over the hole 26 and a further impurity can be diffused into a smaller hole in the regrown oxide coating or as preferred, into the hole 26 itself (as shown in FIG. 5) to form a third region 30 of the same conductivity type as the body 20. This defines a P-N junction 31 between the third region 30 and the merged second and third regions 25 and 27. The second junction 31 extends to the surface 22 underneath the coating 21 about the third region 30.

An additional hole 32 can then be opened through the reformed coating **21*a* to the surface 22 and an ohmic contact 33 applied thereto within the hole 32. In a similar manner, an ohmic contact 34 can be applied to the surface 22 within the hole 26 and another ohmic contact 35 can be applied to the opposite surface of the semiconductor body 20**.

Figure 6:
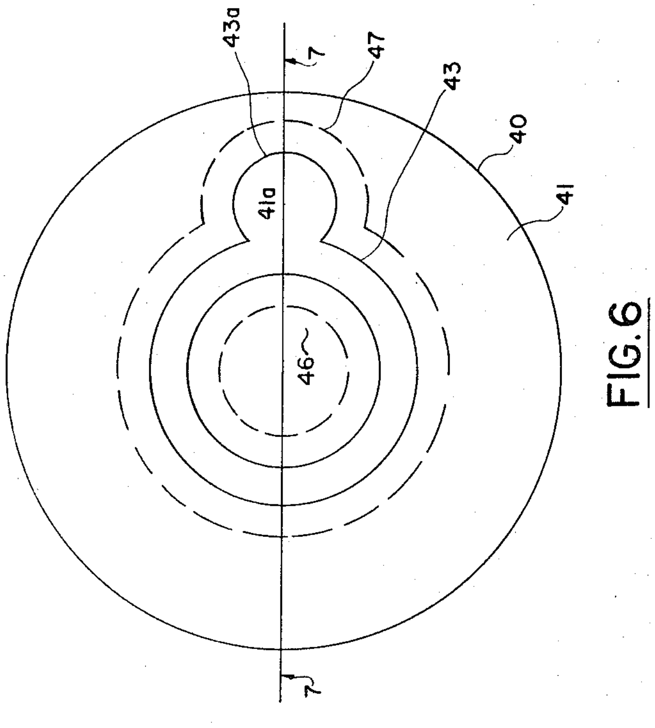
Figure 7:
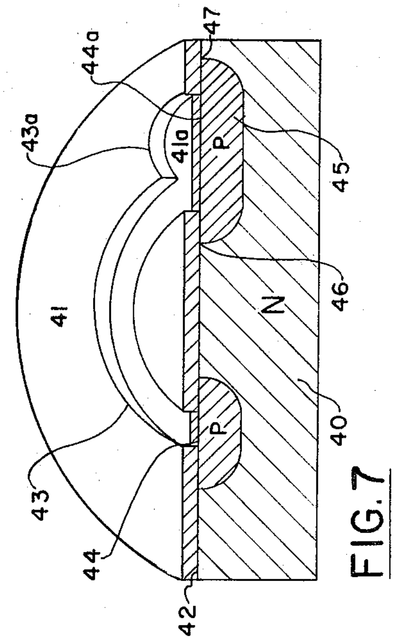

FIGS. 6 to 11 show my preferred embodiment for manufacturing a diffused N-P-N planar silicon transistor suitable for high frequency applications. As shown in FIGS. 6 and 7, a body 40 of N-type silicon has a silicon dioxide coating 41 preferably formed by thermal growing techniques on a polished surface 42. An annular band 43 of the coating 41 is then removed to expose an area 44 of the surface 42. The band 43 has a portion **43*a*** that is thicker than its remaining portions.

The impurity boron having a high surface concentration (greater than $10^{20}$ atoms per cubic centimeter) is then predeposited within the band 43. The boron is diffused to a depth of the order of $1.5\times10^{-3}$ centimeters and a silicon dioxide coating **41*a* is reformed on the surface 40 within the band 43 to a sufficient thickness to mask subsequent diffusions. Because of the predeposition, the reformed coating 41*a* takes place during the diffusion step. A region 45 of P-type silicon is thus formed with the region extending inwardly and outwardly by transverse diffusion underneath the coating 41 to the surface 42 at inner and outer edges 46 and 47**.

Figure 8:
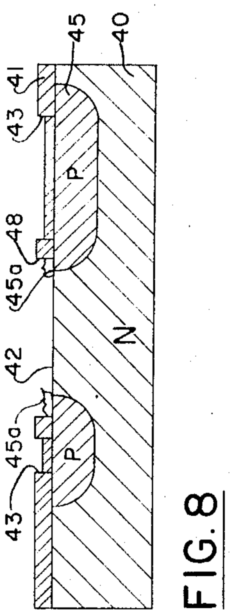
FIGS. 6 to 11 depict the preferred embodiment of my invention with FIG. 6 being a plan view of a transistor at one stage of manufacture, FIG. 7 being a partly sectional, partly perspective view taken along lines 7—7 of FIG. 6, FIGS. 8 to 11 being sectional views of the transistor at later stages of manufacture, and FIG. 11 depicting the finished transistor.

As shown in FIG. 8, a hole 48 adjacent to, but spaced from, the inner periphery of the band 43 is then etched through the coating 41 to the surface 42. The hole 48 is sufficiently close to the hole 43 such that a portion **45*a* of the region 45 that is formed by transverse diffusion is exposed at the surface 42**.

Figure 9:
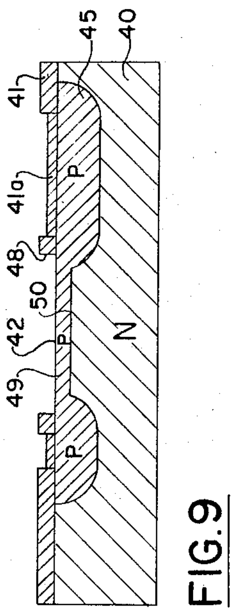

The impurity boron having a lower surface concentration is then predeposited within the hole 48 and diffused to a shallower depth to give the desired base-collector junction depth (FIG. 9). This forms a second region 49 of P-type silicon with the second region 49 merging with and overlapping the first region 45 to define the base-collector junction 50 between the merged layers 45 and 49 and the remainder of the body 40. It is important to note that the hole 48 must be sufficiently close to the inner periphery of the band 43 so that the entire periphery of the region 49 merges with and overlaps the region 45. The junction 50 extends to the surface 42 underneath the coating 41 about the merged regions 45 and 49.

Figure 10:
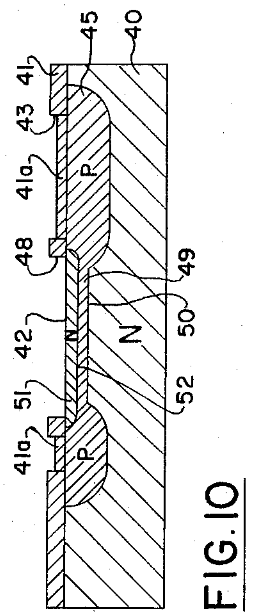

During this latter diffusion, no attempt is made to regrow any oxide within the hole 48. Any oxide that *does* regrow should be thin enough to avoid any subsequent requirement for thermal etching. Any oxide that has regrown within the hole 48 can then be removed by a flash etch and (as shown in FIG. 10) the impurity phosporous can then be diffused at high surface concentration into the hole 48 to give the desired base width of the transistor. A third region 51 of N-type silicon is thus formed to define the emitter-base junction 52 between the region 51 and the merged regions 45 and 49 with the junction 52 extending to the surface 42 underneath the coating 41 about the region 51.

It should be noted that the emitter region 51 reaches the surface in the vicinity of the portion of the region 45 that extends to the surface by transverse diffusion. Or put another way, the emitter region overlaps the region 45. This gives a satisfactory emitter-base junction characteristic. The more surface area **45*a*** that is exposed, the lower will be the base resistivity near the surface. However, this must be limited to preserve a satisfactory emitter-base junction characteristic.

Figure 11:
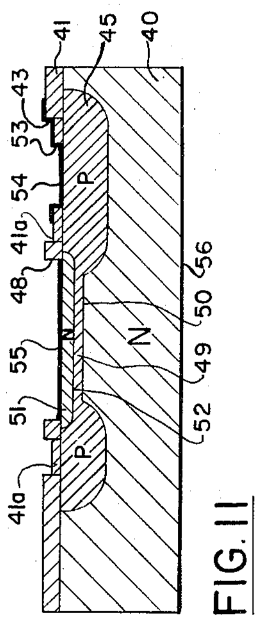

As shown in FIG. 11, a further hole 53 can be opened through the reformed coating **41*a* and an ohmic contact 54 applied to the surface of the base region. Since the heavily conducting region 45 within the silicon structure itself takes the place of a metal contact ring around the surface of the base region, the contact 54 needs to be applied only within the portion 44*a* of the surface area 44**.

Ohmic contacts 55 and 56 can then be applied to the emitter and collector regions respectively. These contacts may overlap the oxide coacting as shown to prov additional bonding area.

As mentioned above, the deep diffusion of the regi 45 contributes to the low bulk resistivity of the b region. In addition, the depletion layer in that portion the base-collector junction between the region 45 and t body 40 will be wider than the depletion layer in tl portion of the base-collector junction between the regi 49 and the body 40. This contributes to a lower capa tance per unit area than can be achieved by prior methods.

It should also be understood that the band 43 does r have to extend completely around the surface of the tra sistor. For example, it could be C shaped or "stri shaped. Other geometries will suggest themselves to the skilled in the art; the important aspect being that the ba 43 should be large enough so that the region 45 will pr duce low bulk resistivity in the base region and to provi sufficient contact area at the surface of the base regic As mentioned above, my invention also has applicati in the manufacture of a diffused planar field-effect tra sistor. A field-effect transistor can be fabricated as P-N or N-P-N structures in a manner generally similar to th described above for a bi-polar transistor (FIGS. 6–11 Therefore, further drawings are not felt to be necessar The diffusions are adjusted to give a smaller channel regi (base) 49 width, and the geometry is such that the tv portions of the first diffused region 45 (source and dra regions) are electrically isolated except for connection the channel 49. This is achieved by carrying ou the fir (deep) diffusion through *two* holes, the second diffusic subsequently joining these two regions. These two hol can conveniently be "strip" shaped.

When the region 51 (upper gate region) is diffuse through the hole 48 it encounters lower surface conce trations near the surface, thus ensuring a higher surfa breakdown characteristic.

What is claimed is:

1. In the manufacture of a semiconductor device, tl method steps of:
   (a) forming a non-conducting coating on a plane su face of a semiconductor body of one conductivi type;
   (b) opening a first hole through said coating to expo an area of said surface;
   (c) diffusing an impurity into said hole to form a fir region of opposite conductivity type to said one co ductivity type, with said region extending by transver diffusion underneath said coating to said surface;
   (d) reforming a non-conducting coating on said surfac within said area;
   (e) opening a second hole adjacent to but spaced fro said first hole through the original coating to sai surface;
   (f) diffusing an impurity into said second hole to forr a second region of said opposite conductivity typ said first and second holes being sufficiently close to gether so that said second region merges with an overlaps said first region, whereby a first P-N junctio is defined between said merged regions and the re mainder of said body, with said junction extending t said surface underneath said coating about sai merged regions, and whereby said second region ove laps said first region at said surface in an area of sai first region formed by said transverse diffusion;
   (g) diffusing an impurity into said second hole to forn a third region of said one conductivity type, wherek a second P-N junction is formed between said thir region and said merged first and second regions, wit said second junction extending to said surface under neath said coating about said third region, and where by said second junction reaches said surface in th area of overlap between said first and second regions
   (h) opening a third hole through said reformed coatin to said surface;

i) and applying ohmic contacts to said first and third regions within said third and second holes respectively.

. A method as defined in claim 1 wherein the first hole ormed by removing a band of said coating, the second e being adjacent to but spaced from the inner periph- of said band, the second hole being sufficiently close he inner periphery of said band so that the entire pe- iery of said second region merges with and overlaps l first region.

. A method as defined in claim 2 wherein said second e exposes a portion of said first region at said surface t is formed by said transverse diffusion.

. A method as defined in claim 3 wherein the diffusion form said first region extends deeper into said surface n the diffusion to form said second region.

. A method as defined in claim 4 wherein the impurity icentration at the surface used to diffuse said first region is greater than the impurity concentration at the surface used to diffuse said second region.

References Cited by the Examiner

UNITED STATES PATENTS

| | | | |
|---|---|---|---|
| 3,152,294 | 10/1964 | Siebertz et al. | 317—235 |
| 3,180,766 | 4/1965 | Williams | 317—235 X |
| 3,183,128 | 5/1965 | Leistiko et al. | 317—235 X |
| 3,183,129 | 5/1965 | Tripp | 317—235 X |
| 3,184,657 | 5/1965 | Moore | 317—234 |
| 3,210,677 | 10/1965 | Lin et al. | 317—235 |
| 3,223,904 | 12/1965 | Warner et al. | 317—235 |

JOHN W. HUCKERT, *Primary Examiner*.

A. M. LESNIAK, *Assistant Examiner*.